(12) United States Patent
Kim et al.

(10) Patent No.: US 8,435,840 B2
(45) Date of Patent: May 7, 2013

(54) FUSE BOX GUARD RINGS INCLUDING PROTRUSIONS AND METHODS OF FORMING SAME

(75) Inventors: Seong-Ho Kim, Seoul (KR); Gil-Sub Kim, Suwon-si (KR); Dong-Kwan Yang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 383 days.

(21) Appl. No.: 12/773,444

(22) Filed: May 4, 2010

(65) Prior Publication Data

US 2010/0283117 A1 Nov. 11, 2010

(30) Foreign Application Priority Data

May 6, 2009 (KR) .................. 10-2009-0039319

(51) Int. Cl.
*H01L 21/82* (2006.01)
*H01L 23/52* (2006.01)

(52) U.S. Cl.
USPC .............. 438/132; 257/529; 257/E21.492; 257/E29.006

(58) Field of Classification Search .............. 257/503, 257/E29.006, E21.492, E21.485, 529; 438/132, 438/131
See application file for complete search history.

(56) References Cited

U.S. PATENT DOCUMENTS

| | | | |
|---|---|---|---|
| 6,163,065 A * | 12/2000 | Seshan et al. | 257/620 |
| 6,300,232 B1 * | 10/2001 | Satoh | 438/601 |
| 6,509,255 B2 | 1/2003 | Minn et al. | |
| 6,949,775 B1 * | 9/2005 | Takada | 257/127 |
| 2003/0168715 A1 | 9/2003 | Bae | |
| 2005/0218477 A1 * | 10/2005 | Takewaki et al. | 257/531 |
| 2006/0226507 A1 * | 10/2006 | Lin et al. | 257/529 |
| 2007/0126029 A1 * | 6/2007 | Kim | 257/209 |
| 2008/0093704 A1 | 4/2008 | Park et al. | |

FOREIGN PATENT DOCUMENTS

| | | | |
|---|---|---|---|
| JP | 2003-078010 | | 3/2003 |
| JP | 2006476438 | * | 6/2005 |
| JP | 2005-209903 | | 8/2005 |
| KR | 10-2005006313 | * | 6/2005 |
| KR | 100724213 B1 | | 5/2007 |
| KR | 100819551 B1 | | 3/2008 |

OTHER PUBLICATIONS

Translation of Han (Korean Patent 10-2005-0063138), Jun. 2005, 9 pages.*

* cited by examiner

*Primary Examiner* — Caridad Everhart
(74) *Attorney, Agent, or Firm* — Myers Bigel Sibley & Sajoviec, P.A.

(57) ABSTRACT

A structure included in a semiconductor device can include a fuse box guard ring that defines an interior region of the fuse box inside the fuse box guard ring and that defines an exterior region of the fuse box outside the fuse box guard ring. The fuse box guard ring can include protruding support members that protruding from an interior sidewall or from an exterior sidewall of the fuse box guard ring.

22 Claims, 14 Drawing Sheets

FUSE BOX GUARD RINGS INCLUDING PROTRUSIONS AND METHODS OF FORMING SAME

CROSS-REFERENCE TO RELATED APPLICATION

This application claims priority to Korean Patent Application 10-2009-0039319, filed on May 6, 2009, in the Korean Intellectual Property Office, the disclosure of which is incorporated by reference herein in its entirety.

FIELD

The present inventive concept relates to the field of semiconductors, and more particularly, to fuse box guard rings in semiconductor devices and methods of forming fuse box guard rings in semiconductor devices.

BACKGROUND

It is known to provide fuses within a semiconductor device which are used to replace defective circuits with redundant circuits so that the device yield may be increased. In particular, once a circuit is diagnosed as being defective, a fuse can be cut (using for example laser light) so that a known good redundant circuit replaces the known defective circuit. The fuse may be cut through a fuse opening in an insulating layer that is formed over the fuse.

A reliability test may be performed on the integrated circuit device under a high moisture content, a high temperature and/or a high pressure to determine whether the integrated circuit device can operate under these circumstances. If, however, moisture permeates the integrated circuit device through the insulating layer, the reliability of the integrated circuit device may be reduced because the moisture may influence the integrity of the metal wiring to/from the fuse.

To address the influence of moisture on the integrated circuit device, fuse box guard rings can be formed around the fuse.

SUMMARY

Embodiments according to the present invention can provide fuse box guard rings having protrusions and methods of forming the same. Pursuant to these embodiments, a structure included in a semiconductor device can include a fuse box guard ring that defines an interior region of the fuse box inside the fuse box guard ring and that defines an exterior region of the fuse box outside the fuse box guard ring. The fuse box guard ring can include protruding support members that protruding from an interior sidewall or from an exterior sidewall of the fuse box guard ring.

DETAILED DESCRIPTION OF EMBODIMENTS ACCORDING TO THE INVENTIVE CONCEPT

Figure 1A:
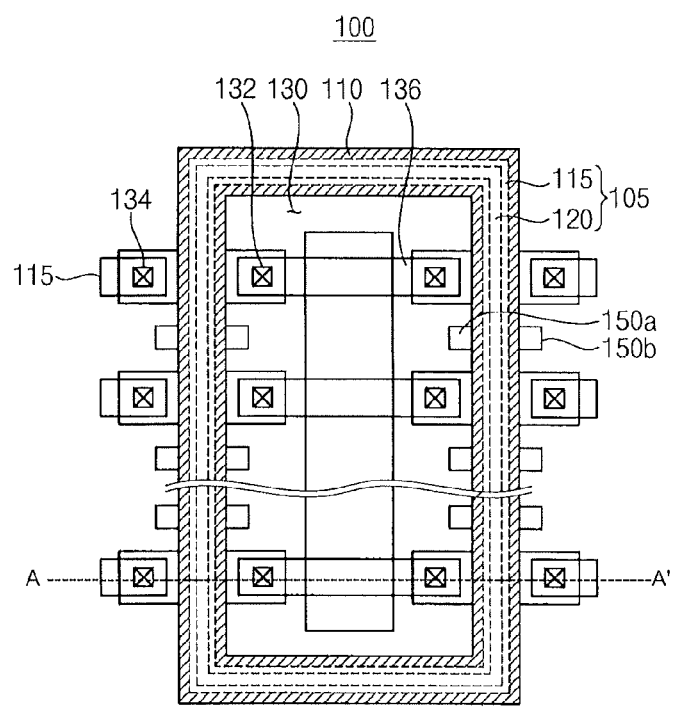
FIG. 1A is a plan view illustrating a fuse box having a fuse box guard ring including protruding support members which protrude from the side walls of the fuse box guard ring in some embodiments according to the inventive concept.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As described herein in greater detail, in some embodiments according to the inventive concept, a fuse box guard ring can be formed with protruding support members which protrude from at least one side wall of the fuse box guard ring. The protruding support members can be formed in a conductive layer that defines a portion of the side wall. Further, the protruding support members are formed in the conductive layer as a result of a photolithography step using a high aspect ratio photo resist pattern. In particular, the high aspect photo resist pattern can be formed on the conductive layer to include features which protrude from side walls of the photo resist pattern, which lead to the formation of the protruding support members protruding from at least one sidewall of the fuse box guard ring. The features of the high aspect photo resist pattern, which lead to the formation of the protruding support members, are formed to provide lateral support to the high aspect photo resist pattern to reduce deflection of the high aspect photo resist pattern so that patterning can result in a more accurate transfer to the underlying conductive layer.

It will be understood that the features in the photo resist pattern (used to form the protruding support members) can decrease the aspect ratio of those portions of the pattern which correspond to the features. Decreasing the aspect ratio can lead to the reduced deflection of the entire high aspect ratio pattern. It will be further understood that although the protruding support members shown herein are rectangular in shape, other shapes and sizes may be used. Accordingly, the features included in the high aspect ratio photo resist pattern can be formed in any shape that decreases the localized aspect ratio of the photo resist pattern. It will also be understood that the above features can be used to reduce the deflection of any high aspect ratio photo resist pattern used to form any structures in devices where the step height difference between regions is significant enough to cause relatively high deflection (if left unaddressed). Accordingly, the features of the high aspect ratio photo resist pattern can be used to form structures other than fuse box guard rings.

In some embodiments according to the inventive concept, the protruding support members protrude only from a single side wall (such as either the interior or the exterior side wall of the fuse box guard ring). In other embodiments according to the inventive concept, the protruding support members can protrude from both the exterior and the interior side wall of the fuse box guard ring. In still further embodiments according to the inventive concept, the protruding support members protruding from both the interior and exterior side wall are offset from one another whereas in other embodiments according to the inventive concept, the protruding support members protruding from both the exterior and the interior side wall are aligned to one another.

In still further embodiments accord to the inventive concept, the protruding support members protrude from opposing interior side walls of the fuse box guard ring and completely traverse the interior region toward one another to provide interior fuse box guard ring cross-members. In other embodiments according to the inventive concept, the cross members are also contacted by extension portions which extend orthogonal to the cross members to contact the other interior side walls of the fuse box guard ring.

It will be further understood that the protruding support members can protrude from a major surface of the side wall of the conductive layer, which makes up a portion of the fuse box guard ring side wall. Further, the conductive layer can be the lowermost structure that makes up the fuse box guard ring, so that the protruding support members protrude from the major surface of the conductive layer side wall included in the fuse box guard ring.

FIG. 1A is a plan view which illustrates a fuse box 100 including a fuse box guard ring 105 which at least partially encloses an interior region 130 of the fuse box 100. The interior region 130 includes a plurality of fuses 136 which traverse the interior region 130 and connect to first connectors 132 on opposing sides of the interior region 130. It will be understood that the first connectors 132 can be electrically coupled to a bit line 125 included in the semiconductor device, which provides both the electrical connectivity for the fuse box 100 as well as the material for the fuses 136 themselves. A metal layer 115 can be used to form the fuses 136 and to form an upper level of metallization that connects to contacts 120, both inside and outside the fuse box guard ring 105. In operation, a laser light can be selectively impinged upon the fuses 136 to replace known defective circuits with redundant circuits so that the semiconductor device may be rendered operable.

The fuse box guard ring 105 includes a portion of the metal layer 115 and the metal contact 120 which extends from the metal layer 115 toward a substrate 101 and contacts a conductive layer 110. It will be understood that in some embodiments according to the inventive concept, the conductive layer 110 can be a plate poly layer, however, other conductive materials can be used. In some embodiments according to the inventive concept, the metal layer 115, the metal contact 120, and the conductive layer 110 define the profile (sometimes referred to herein as the major surface) of the interior and/or exterior side walls of the fuse box guard ring 105 from which the protruding support members protrude. Further, in some embodiments according to the inventive concept, the conductive layer 110 includes the major surface which faces the interior region 130 or the exterior of the fuse box guard ring 105.

Figure 1B:
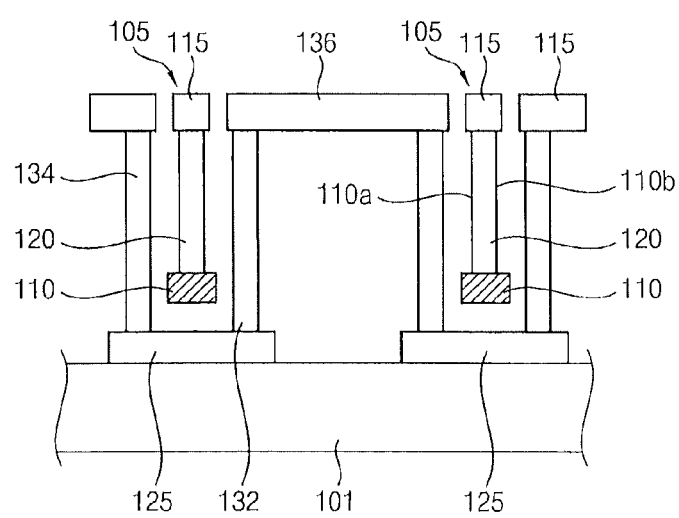
FIG. 1B is a cross-sectional view cut along a line A-A' of FIG. 1A.

According to FIG. 1B, a portion of the metal layer 115 located in the exterior region of the fuse box 100 extends outside the fuse box guard ring 105 and is connected to ha second connector 134 which extends downward in the device to connect with a bit line 125 which extends beneath the conductive layer 110 above the substrate 101. The bit line 125 extends from a lower portion of the second connector 134 in the exterior region to the corresponding lower portion of the first connector 132 in the interior region 130. The first connector 132 in the interior region 130 extends upward to contact an outer portion of the metal layer 115, which also forms the fuses 136 located in the interior region 130. Accordingly, the fuse box guard ring 105 can provide a moisture resistant barrier for the fuses 136 in the interior region 130 to improve the reliability thereof.

Referring still to FIG. 1A, protruding support members 150a and 150b, protrude from both an interior side wall 110a and from an exterior side wall 110b of the fuse box guard ring 105. It will be understood the protruding support members 150a and 150b can be artifacts resulting from the formation of the conductive layer 110 as part of the fuse box guard ring 105 resulting from features included as part of the photo resist pattern used to form the conductive layer 110. In some embodiments according to the inventive concept, however, the protruding support members 150a and 150b can protrude from other portions of the fuse box guard ring 105.

Figure 2:
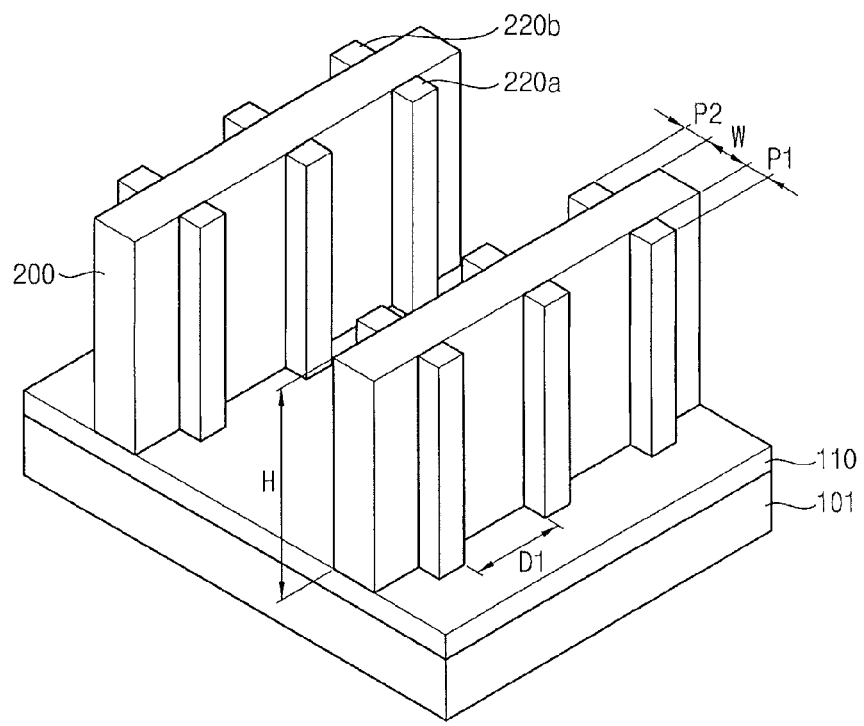
FIG. 2 is perspective view of a photo resist pattern formed on a conductive layer, where the photo resist pattern includes features protruding from side walls of the photo resist pattern in some embodiments according to the inventive concept.

FIG. 2 is a perspective view of a photo resist pattern 200 formed on the conductive layer 110 on the substrate 101. The photo resist pattern 200 includes features 220a and 220b formed on opposing side walls of the pattern 200. It will be understood the aspect ratio of the photo resist pattern 200 can be defined by the height of the pattern H divided by the width of the pattern W as described herein. As appreciated by the present inventors, relatively high aspect ratio photo resist patterns can exhibit excessive deflection to the point where structures on the underlying layers can be misaligned to the photo resist patterns. However, as further shown in FIG. 2, the features 220a and 220b protrude from the opposing side walls by respective dimensions P2 and P1 so the aspect ratio of the photo resist pattern 200 at those locations can be reduced by increasing the width of the photo resist pattern locally. Furthermore, the features 220a and 220Bb can be spaced apart along the sidewall by a distance D1. The distance D1 can be selected to provide more or less rigidity to the photo resist pattern 200. In particular, a lesser distance D1 can provide more rigidity. Accordingly, the aspect ratio of the photo resist pattern at those locations corresponding to the protrusions can be decreased thereby providing a reduction in the deflection of the photo resist pattern 200.

Figure 3:
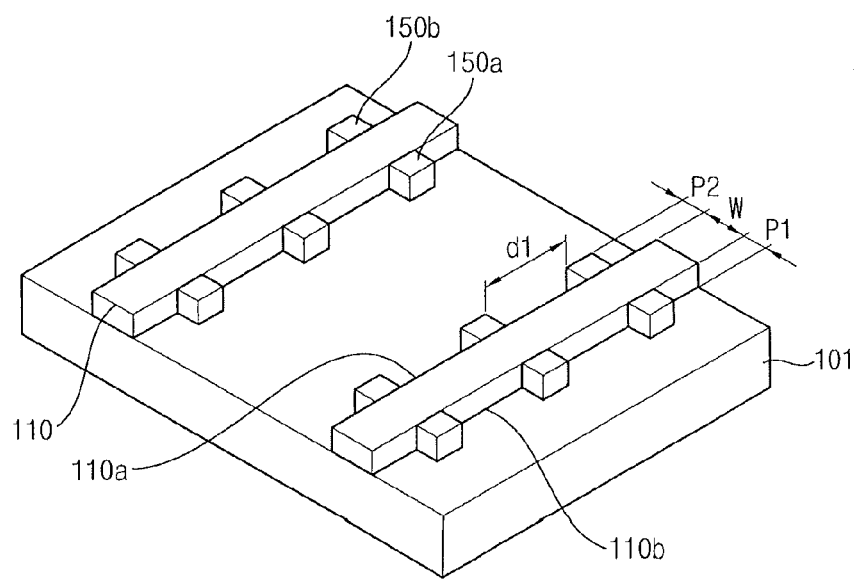
FIG. 3 is a perspective view which illustrates portions of a fuse box guard ring patterned into the conductive layer using the photo resist pattern shown in FIG. 2 so that the fuse box guard ring includes protruding support members which protrude from the side walls of the fuse box guard ring in some embodiments according to the inventive concept.

As shown in FIG. 3, the photo resist pattern 200 shown in FIG. 2 is used to pattern the underlying conductive layer 110 to form a lowermost portion of the fuse box guard ring 105 above the substrate 101 to include the protruding support members 150a and 150b, which protrude from the interior side wall and from the exterior side wall of the fuse box guard ring 105 respectively. Furthermore, the protruding support members 150a and 150b can be formed to protrude by amounts P2 and P1 respectively. The protruding support members 150a and 150b can be formed on both the interior and exterior sidewall at locations which are directly opposite to one another.

Figure 4:
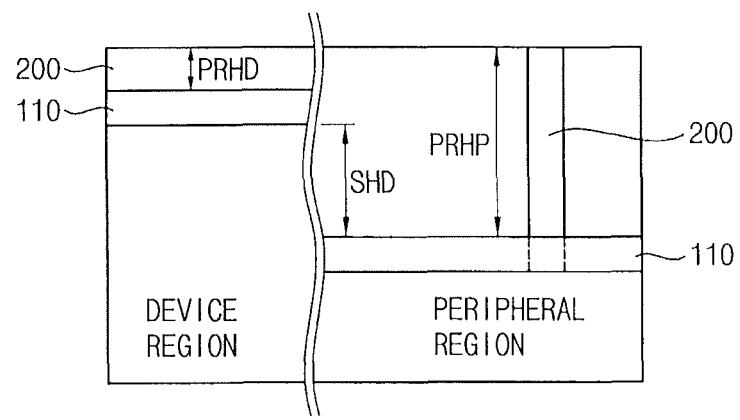
FIG. 4 is a cross sectional view which illustrates a step height difference between a device region and a peripheral region associated with the formation of photo resist pattern in both regions in some embodiments according to the inventive concept.

FIG. 4 is a schematic view of two separate regions of the semiconductor device including the photo resist pattern 200 formed on both regions in some embodiments according to the inventive aspect. In particular, the photo resist pattern 200 is formed in both a device region as well as in a peripheral region which is spaced apart from the device region. The photo resist pattern 200 is formed on the conductive layer 110 in each of the regions. As shown in FIG. 4, a step height difference (SHD) is defined by a difference in height between an upper surface of the conductive layer 110 in the peripheral region and a corresponding upper surface of the conductive layer 110 in the device region. It will be understood that because the structures formed in the device region can be substantially thicker than structures formed in the peripheral region, thereby contributing to a significant portion of the step height difference between the two regions.

Accordingly, when the photo resist pattern 200 is formed on the conductive layer 110, and then planarized, using for example spin coating or CMP, the photo resist pattern 200 in the peripheral region stands at the height PRHP whereas the photo resist pattern in the device region has a thickness of PRHD. Accordingly, the height PRHP can be such that the resist pattern 200 may deflect due to the relatively high aspect ratio which can cause patterning problems when acting upon the conductive layer 110. Accordingly the protruding support members formed as part of the photo resist pattern 200 in the peripheral region can reduce the deflection of the photo resist pattern having a relatively high aspect ratio. Furthermore, the features formed as part of the photo resist pattern 200 in the peripheral region are transferred to the conductive layer 110 to form the protruding support members 150.

Although FIG. 4 illustrates a particular situation where the step height difference exists between the device and peripheral regions, it will be understood that embodiments according to the inventive aspect can be utilized in any areas of the semiconductor device where step height difference is significant. Further, it will be understood that embodiments according to the inventive aspect can be utilized to provide reduced deflection to structures other than photo resist patterns.

Figure 5:
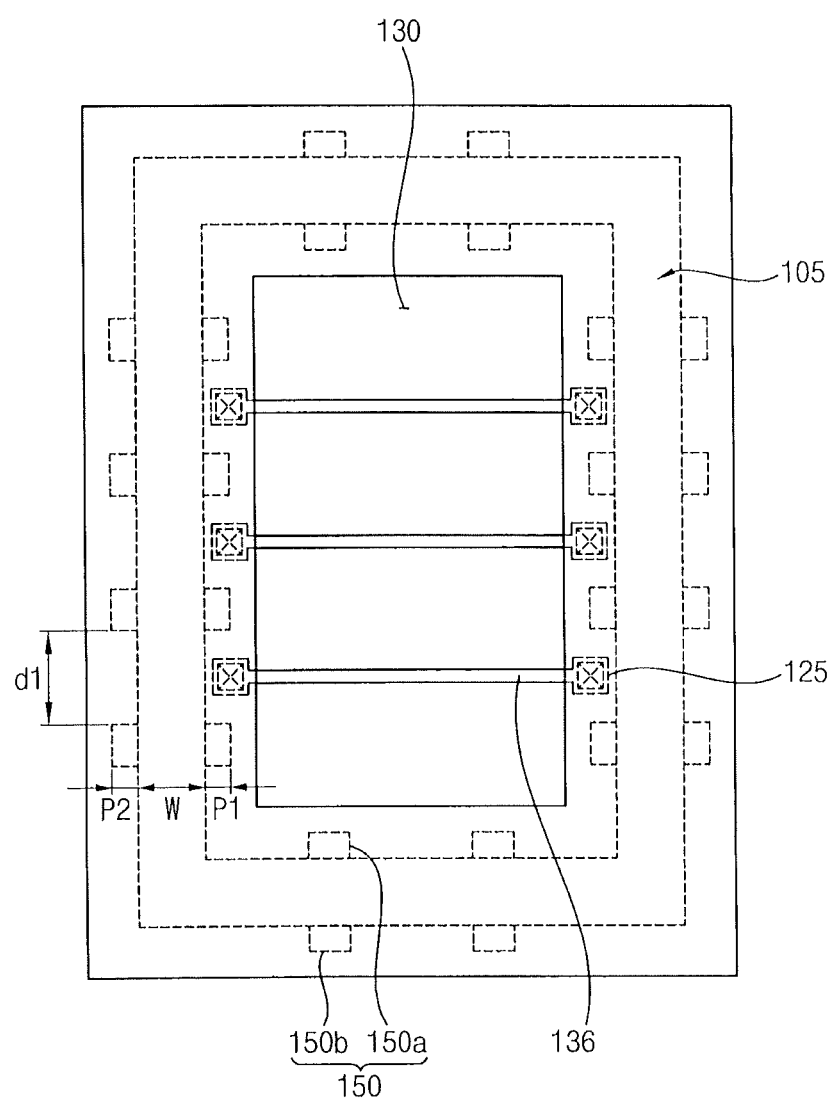
FIG. 5 is a plan view which illustrates a fuse box including a fuse box guard ring including protruding support members which protrude from both interior and exterior side walls of the fuse box guard ring in some embodiments according to the inventive concept.

FIG. 5 is a plan view of the fuse box 100 including the fuse box guard ring 105 defining the interior region 130 which includes fuses 136 which traverse the interior region 130 to connect with fuse contacts 125 as part of an upper metal layer connected to same metal layer in an exterior region of the fuse box 100 which is outside the fuse box guard ring 105. As further shown in FIG. 5, protruding support members 150a and 150b protrude from the interior side wall and from the exterior side wall of the fuse box guard ring 105, and in particular, from the major surface of the interior side wall and from an exterior side wall of the conductive layer 110 included in the fuse box guard ring 105. It will be understood that the term "major surface" includes surfaces According to FIG. 5, the protruding support members 150a and 150b can protrude from the major interior side wall and major exterior side wall of the fuse box guard ring 105 which includes the interior and exterior side walls of the conductive layer 110. As further shown in FIG. 5, the protruding support members 150a and 150b can protrude from the respective side walls by distances P1 and P2 respectively. The width of the conductive layer 110 can be a width W1 which can be used in the determination of the aspect ratio thereof. Furthermore, the protruding support members can be spaced apart from one another on the interior and exterior side wall by a distance d1. In some embodiments according to the inventive concept, the protruding support members 150a and 150b are evenly spaced around the fuse box guard ring 105 whereas in other embodiments according to the inventive concept the protruding support members 150a and 150b are unevenly spaced on both the interior and exterior side wall.

Figure 6:
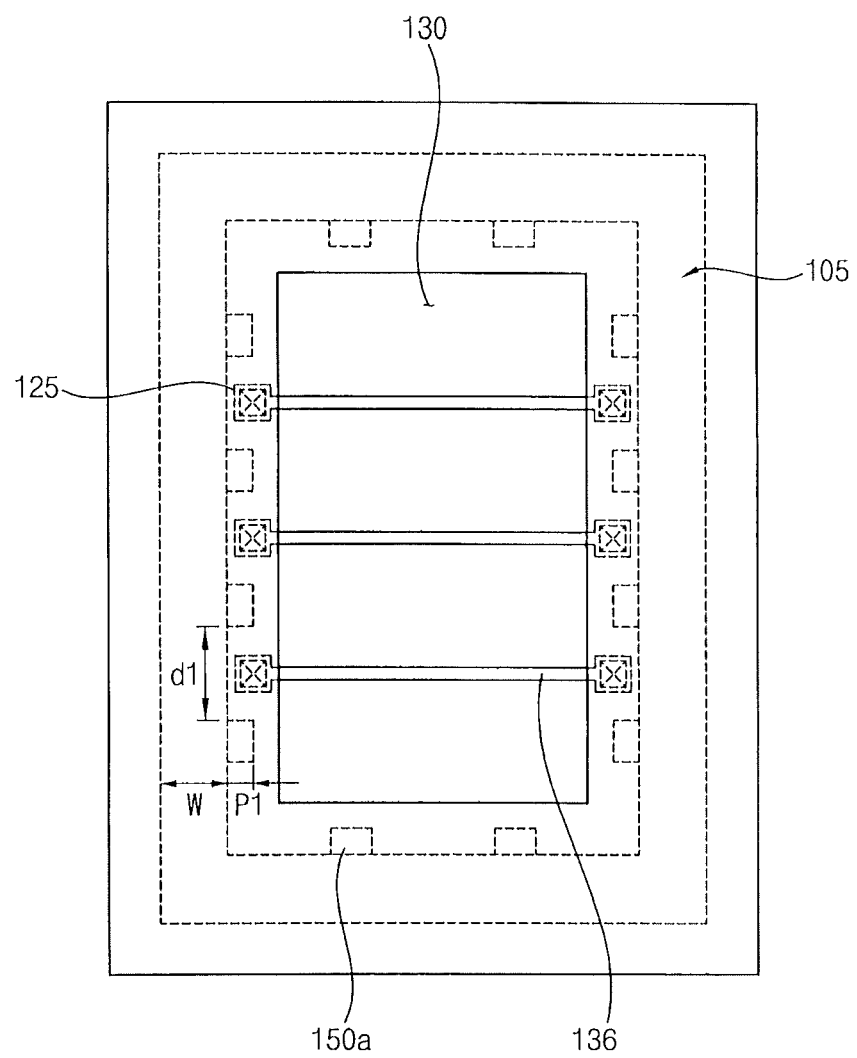
FIG. 6 is a plan view which illustrates a fuse box including a fuse box guard ring including protruding support members which protrude only from the interior side wall of the fuse box guard ring in some embodiments according to the inventive concept.

FIG. 6 is a plan view illustrating a fuse box including the conductive layer 110 as part of the fuse box guard ring 105 in some embodiments according to the inventive concept. According to FIG. 6, the interior region 130 of the fuse box guard ring includes the fuses 136 which traverse the interior region 130 to connect to the fuse contacts 125. As further shown in FIG. 6, protruding support members 150a protrude only from the major surface of the interior side wall of the conductive layer 110. It will be understood that the protruding support members 150a can be evenly spaced by a distance d2 along the interior side wall, whereas in other embodiments according to the inventive concept, the protruding support members 150a are unevenly spaced along the interior side wall. As further shown in FIG. 6, the protruding support members 150a can protrude the major surface of the conductive layer 110 by a distance P3 in addition to the width W2 corresponding to the width of the conductive layer 110 thereat.

Figure 7:
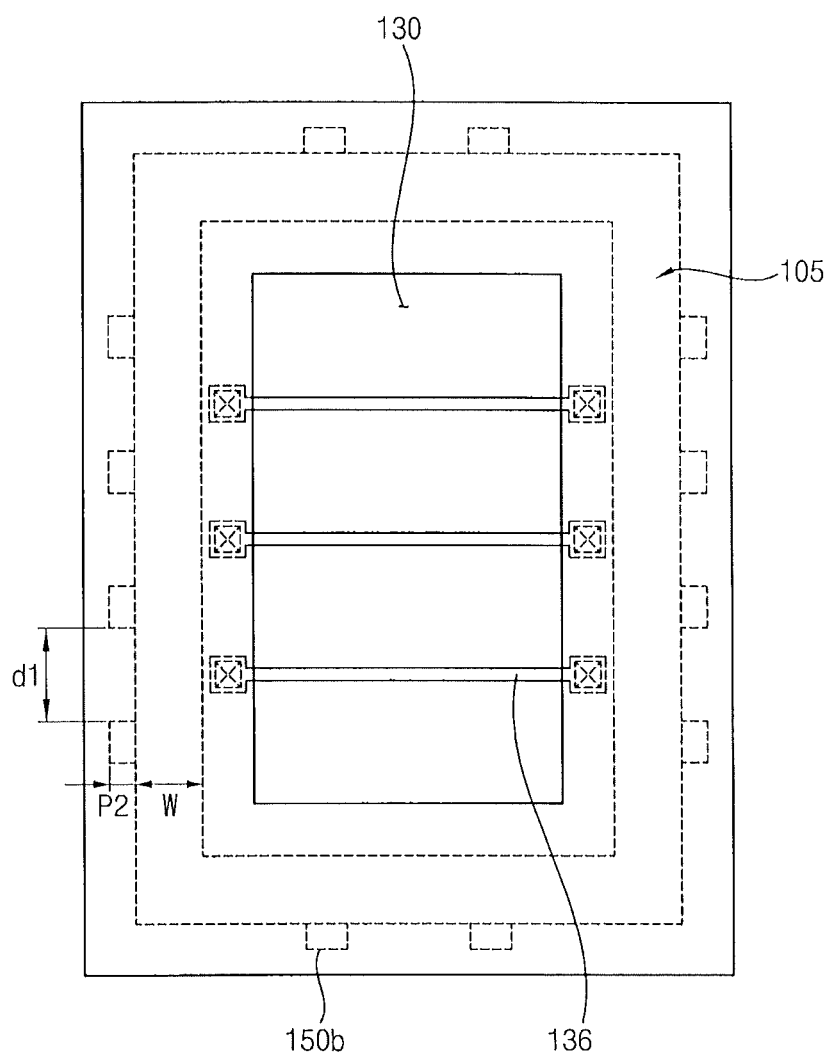
FIG. 7 is a plan view which illustrates a fuse box including a fuse box guard ring including protruding support members which protrude only from the exterior side wall of the fuse box guard ring in some embodiments according to the inventive concept.

FIG. 7 is a plan view illustrating the fuse box guard ring including the conductive layer 110 having protruding support members 150b protruding from the exterior side wall therefrom in some embodiments according to the inventive concept. According to FIG. 7, the fuse box 100 includes the conductive layer 110 as part of the fuse box guard ring 105 side wall which defines the interior region 130 including the fuses 136 which traverse the interior region 130. As further shown in FIG. 7, the protruding support members 150b protrude only from a major surface of the exterior side wall of the conductive layer 110. Further, the protruding support members 150b can protrude from the exterior side wall according to a uniform spacing distance d3. In other embodiments according to the inventive concept, the spacing between the protruding support members 150b can be irregular. As further shown in FIG. 7, the protruding support members 150b pro- trude from the exterior side wall by a distance P4 in addition to width W3 of the conductive layer 110 and all other portions thereof.

Figure 8:
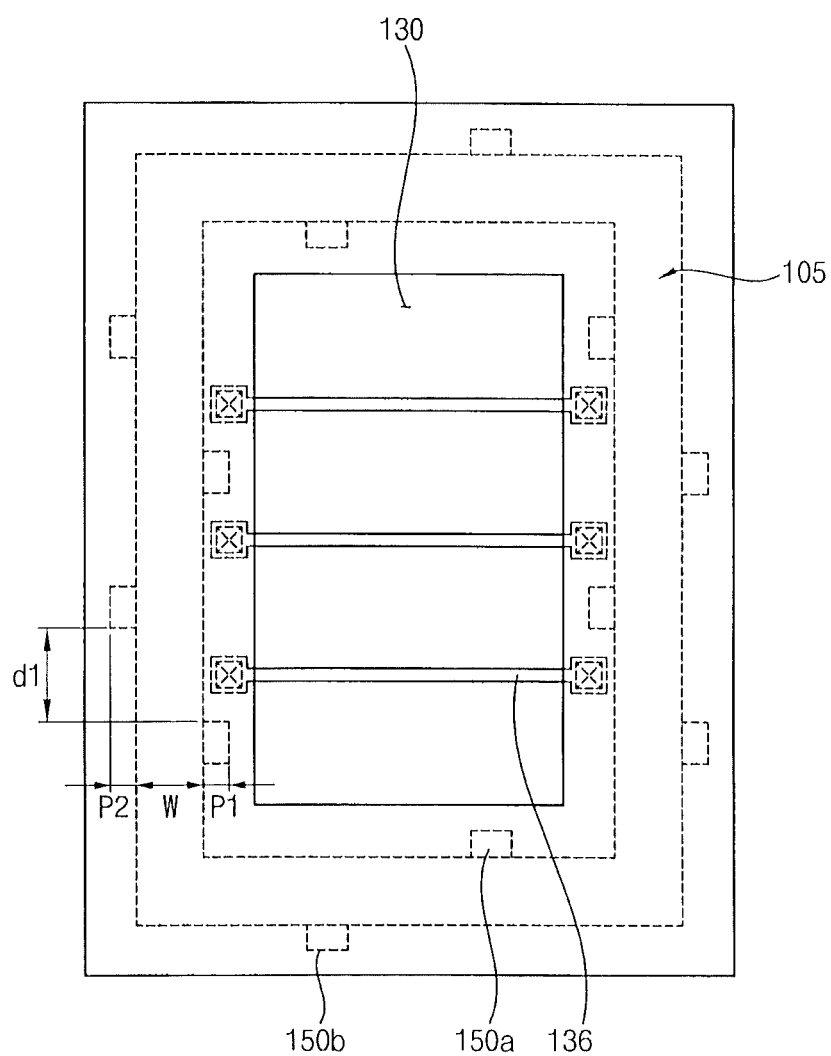
FIG. 8 is a plan view which illustrates a fuse box including a fuse box guard ring including protruding support members which protrude from both the interior and exterior side walls at locations which are offset from one another in some embodiments according to the inventive concept.

FIG. 8 is a plan view which illustrates a fuse box including the conductive layer 110 as part of the fuse box guard ring 105 which defines the interior region 130 containing the fuses 136 which traverse the interior region 130. According to FIG. 8, the protruding support members 150a and 150b protrude from major surfaces of both the interior side wall and the exterior side wall of the conductive layer 110 in an alternating fashion so that each of the protruding support members 150a and 150b protrudes from the opposite side wall from each of it's immediate neighbors. The protruding support members 150a and 150b can protrude from the exterior side wall according to a uniform spacing distance d4. In other embodiments according to the inventive concept, the spacing between the protruding support members 150a and 150b can be irregular. As further shown in FIG. 8, the protruding support members can protrude from the major surface of the interior side wall by a distance P5 and from the major surface of the exterior side wall by a distance P6. Furthermore, a width of the conductive layer 110 at all locations thereof is W4. As shown in FIG. 8, the protruding support members 150a and 150b are spaced to be unaligned to one another.

Figure 9:
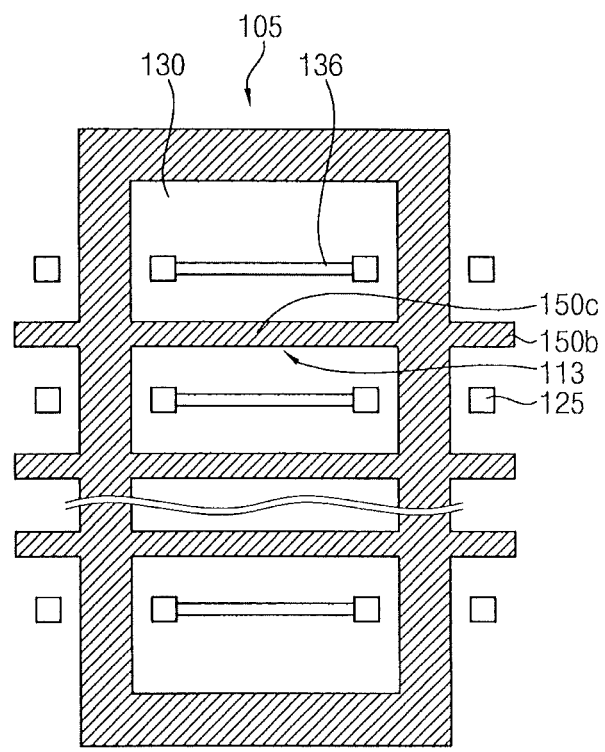
FIG. 9 is a plan view which illustrates a fuse box including a fuse box guard ring including protruding support members which protrude from both the interior and exterior side walls of the fuse box guard ring and wherein the interior protrusions traverse the interior region of the fuse box guard ring to contact the opposing side wall in some embodiments according to the inventive concept.

FIG. 9 is a plan view which illustrates the fuse box guard ring 105 including the conductive layer 110 which defines the interior region 130 of the fuse box guard ring 105 having the fuses 136 located therein. The fuses 136 traverse the interior region 130 to connect to the electrical contacts 120. As further shown in FIG. 9, protruding support members 150b protrude from the major surface of the exterior side wall of the conductive layer 110 and protrude from directly opposing portions of the interior side wall and completely traverse the interior region 130 to provide interior fuse box guard ring cross-members 113 which contact the opposing portion of the interior side wall.

Figure 10:
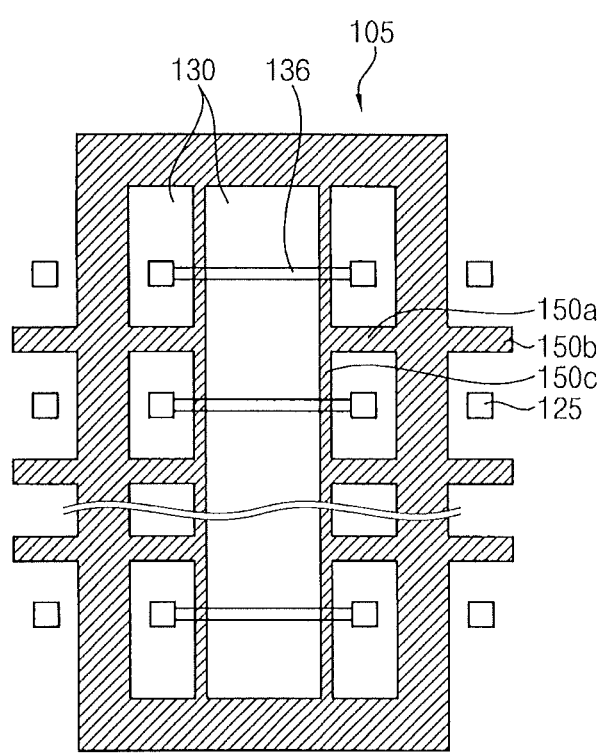
FIG. 10 is a plan view which illustrates a fuse box including a fuse box guard ring having protruding support members which protrude from the interior side walls to traverse the interior region to contact the opposing side wall and where extension portions of the cross members extend to contact the remaining interior side walls of the fuse box guard ring in some embodiments according to the inventive concept.

FIG. 10 is a plan view which illustrates the fuse box 100 including the conductive layer 110 as part of the fuse box guard ring 105 in some embodiments according to the inventive concept. The fuse box guard ring 105 defines the interior region 130 which includes the fuses 136 connected to electrical contacts 125 in the interior region 130. Furthermore, protruding support members 150a and 150b protrude from major surfaces of the interior side wall and exterior side wall respectively. The protruding support members 150a which protrude from the major surface of the interior side wall of the conductive layer 110 extend into the interior region 130 to contact fuse box guard ring cross members 150c which extends to the protruding support members 150a on both sides of the interior region 130. It will be understood that although the fuse box guard ring cross members 150c are shown to have a different thickness than the protruding support members 150a, the fuse box guard ring cross members 150c can be any thickness and can be positioned in any portion of the interior region 130 so that the cross members 150c extend in the interior region 130 perpendicular to the protruding support members 150a. Further, the cross members 150c contact portions of the interior side wall of the conductive layer 110 which are perpendicular to those portions of the side wall from which the protruding support members 150a protrude.

Figure 11:
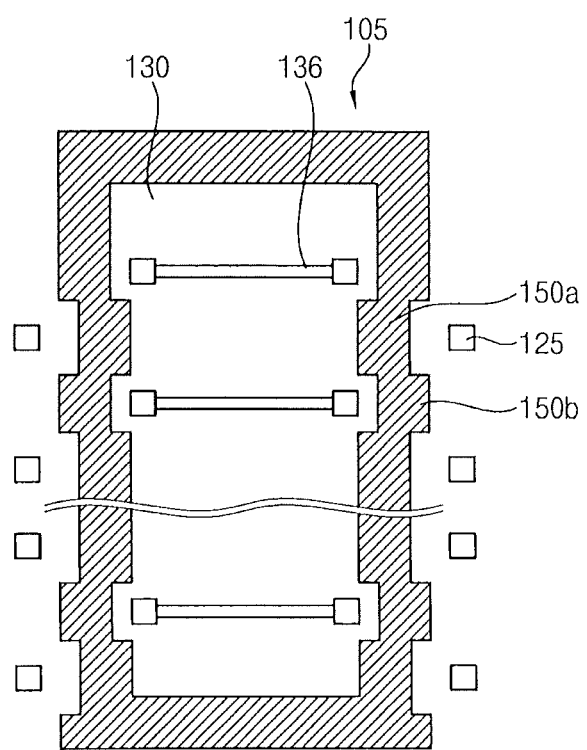
FIG. 11 is a plan view of a fuse box including a fuse box guard ring wherein protruding support members protrude from side walls of the fuse box guard ring according to a serpentine profile to provide both the protruding support members and directly opposing recessed portions of the fuse box guard ring side walls in some embodiments according to the inventive concept.

FIG. 11 is a plan view which illustrates the fuse box 100 including the conductive layer 110 included as part of the fuse box guard ring 105 in some embodiments according to the inventive concept. According to FIG. 11, the fuse box guard ring 105 defines the interior region 130 which includes the fuses 136 which electrically connect to the contacts 125. As further shown in FIG. 11, protruding support members 150a and 150b protrude from the major surfaces of the interior and the exterior side wall respectively. Moreover, the pattern provided by the protruding support members 150a and 150b defines a serpentine profile for the conductive layer 110. The protruding support members 150a and 150b are aligned to directly opposing recessed portions of the side wall of the conductive layer 110. For example, each of the protruding support members 150a which protrude from the major surface of the interior side wall is located directly opposite a recessed portion of the major surface of the exterior side wall of the conductive layer 110.

Figure 12:
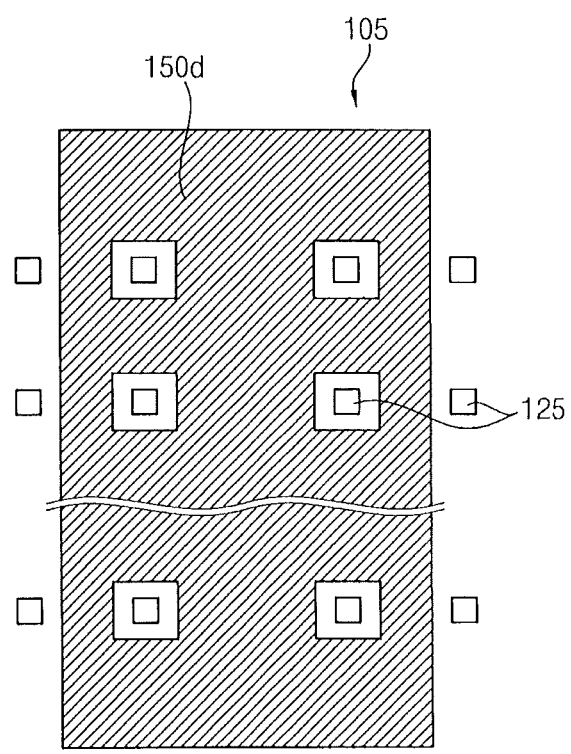
FIG. 12 is a plan view illustrating a fuse box including a fuse box guard ring including protruding support members which protrude from the interior side wall of the fuse box guard ring side walls to fill the interior region of the fuse box so that voids are located at contacts for the fuses in the interior region in some embodiments according to the inventive concept.

FIG. 12 is a plan view which illustrates the fuse box 100 including the conductive layer 110 as part of the fuse box guard ring in some embodiments according to the inventive concept. In particular, the conductive layer 110 includes protruding support members which protrude from the interior side wall of the conductive layer 110 to fill the interior region defined by the fuse box guard ring. In particular, the protruding support members 150d extend to fill the interior region 130 except for portions which are co-located with the fuse contacts 125 located in the interior region.

Figure 13:
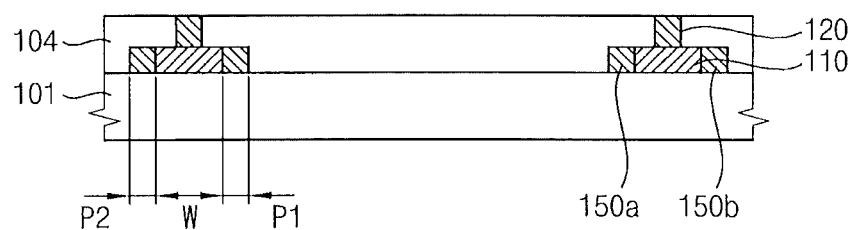
FIGS. 13-18 are cross sectional views which illustrates methods of forming fuse boxes including fuse box guard rings having protruding support members protruding from side walls of the fuse box guard ring in some embodiments according to the inventive concept.

FIGS. 13-18 are cross sectional views which illustrate methods of forming the fuse box including the fuse box guard ring 105 having protruding support members 150 in some embodiments according to the inventive concept. According to FIG. 13, a substrate 101 is provided and an insulating layer 104 is provided thereon having the conductive layer 110 formed, to a width W, therein with protruding support members 150 protruding from the major sidewall surfaces. As shown in FIG. 13, the protruding support members 150 protrude a distance P1 and P2 from the interior sidewall and exterior sidewall of the conductive layer 110, respectively. The protruding support members 150 are formed as described herein with reference to, for example, FIGS. 2-4. A portion of the contact 120 is formed over the conductive layer 110 which is also included in the insulating layer 101.

Figure 14:
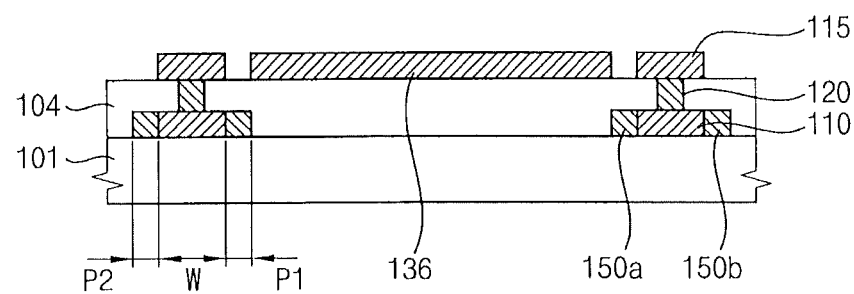
Figure 15:
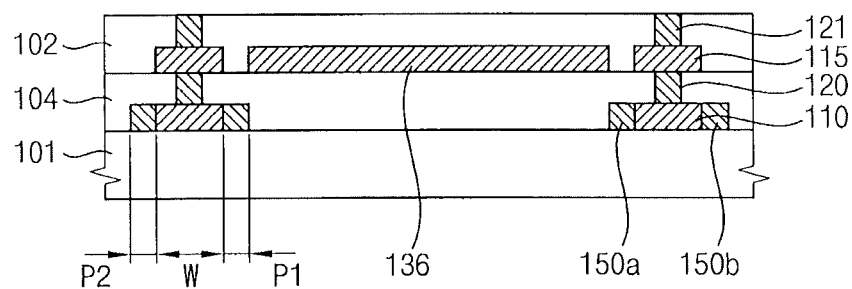

According to FIG. 14, a metal is formed on the insulating layer 104 and patterned to provide the fuses 136 and the portions of the metal layer 115 providing the upper portion of the fuse box guard ring 105. According to FIG. 15, a second insulating layer 102 is formed on the insulating layer 104 to encapsulate the fuses 136 and the portions of the metal layer 115 formed above the protruding support members 150 and upper contact portions 121 extending upward from the metal layers 115.

Figure 16:
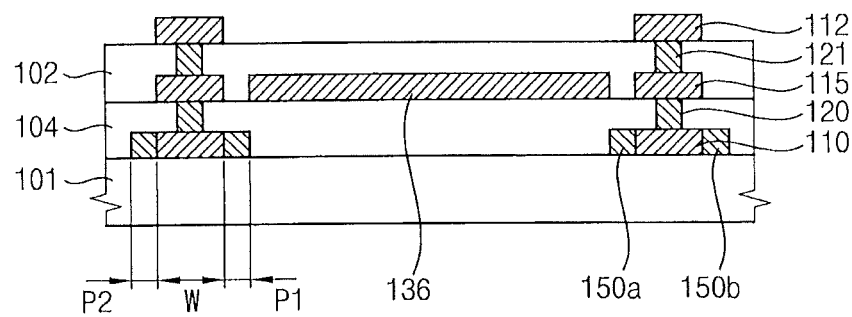
Figure 17:
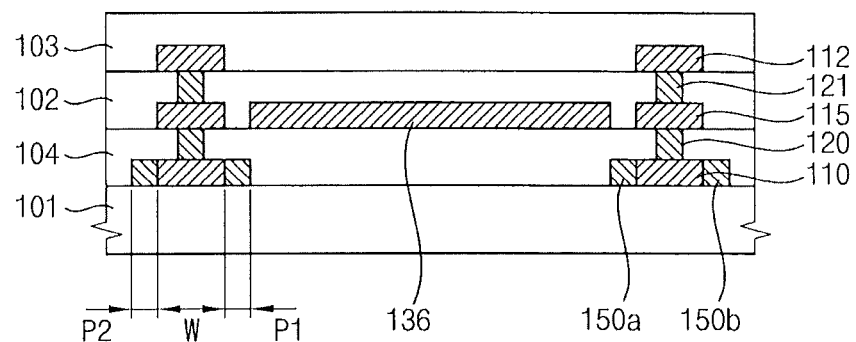
Figure 18:
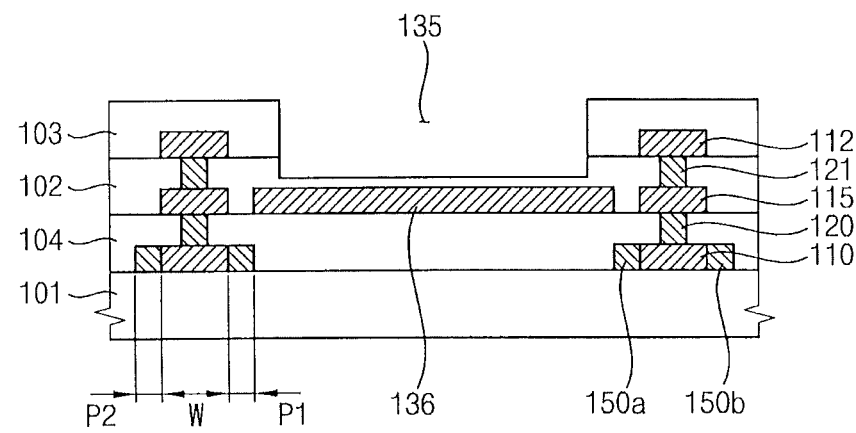

According to FIG. 16, upper metal layers 112 are formed on the second insulating layer 102 above the upper contact portions 121 and a third insulating layer 103 is formed to encapsulate the upper contact portions 121 as shown in FIG. 17. According to FIG. 18, the third insulating layer 103 is patterned to form a window 135 through which the fuses 136 can irradiated using laser light to selectively blow the fuses 136. It will be understood that although FIGS. 13-18 illustrate the formation of a lower level of the conductive layer 110 followed by an intermediate level of metallization and contacts in the second insulating layer 102 and a third level of metallization in the third insulating layer 103, the third level of metallization may be eliminated in some embodiments according to the inventive concept so that the metal layer 115 used to form the fuses 136 can represent the uppermost portion of the fuse box guard ring 105 in some embodiments according to the inventive concept.

As described herein, in some embodiments according to the inventive concept, a fuse box guard ring can be formed with protruding support members which protrude from at least one side wall of the fuse box guard ring. The protruding support members can be formed in a conductive layer that defines a portion of the side wall. Further, the protruding support members are formed in the conductive layer as a result of a photolithography step using a high aspect ratio photo resist pattern. In particular, the high aspect photo resist pattern can be formed on the conductive layer to include features which protrude from side walls of the photo resist pattern, which lead to the formation of the protruding support members protruding from at least one sidewall of the fuse box guard ring. The features of the high aspect photo resist pattern, which lead to the formation of the protruding support members, are formed to provide lateral support to the high aspect photo resist pattern to reduce deflection of the high aspect photo resist pattern so that patterning can result in a more accurate transfer to the underlying conductive layer.

It will be understood that the features in the photo resist pattern (used to form the protruding support members) can decrease the aspect ratio of those portions of the pattern which correspond to the features. Decreasing the aspect ratio can lead to the reduced deflection of the entire high aspect ratio pattern. It will be further understood that although the protruding support members shown herein are rectangular in shape, other shapes and sizes may be used. Accordingly, the features included in the high aspect ratio photo resist pattern can be formed in any shape that decreases the localized aspect ratio of the photo resist pattern. It will also be understood that the above features can be used to reduce the deflection of any high aspect ratio photo resist pattern used to form any structures in devices where the step height difference between regions is significant enough to cause relatively high deflection (if left unaddressed). Accordingly, the features of the high aspect ratio photo resist pattern can be used to form structures other than fuse box guard rings.

In some embodiments according to the inventive concept, the protruding support members protrude only from a single side wall (such as either the interior or the exterior side wall of the fuse box guard ring). In other embodiments according to the inventive concept, the protruding support members can protrude from both the exterior and the interior side wall of the fuse box guard ring. In still further embodiments according to the inventive concept, the protruding support members protruding from both the interior and exterior side wall are offset from one another whereas in other embodiments according to the inventive concept, the protruding support members protruding from both the exterior and the interior side wall are aligned to one another.

In still further embodiments accord to the inventive concept, the protruding support members protrude from opposing interior side walls of the fuse box guard ring and completely traverse the interior region toward one another to provide interior fuse box guard ring cross-members. In other embodiments according to the inventive concept, the cross members are also contacted by extension portions which extend orthogonal to the cross members to contact the other interior side walls of the fuse box guard ring.

It will be further understood that the protruding support members can protrude from a major surface of the side wall of the conductive layer, which makes up a portion of the fuse box guard ring side wall. Further, the conductive layer can be the lowermost structure that makes up the fuse box guard ring, so that the protruding support members protrude from the major surface of the conductive layer side wall included in the fuse box guard ring.

It will be apparent to those skilled in the art that various modifications and variations can be made in the invention. Thus, it is intended that the invention covers the modifications and variations of this invention provided they come within the scope of the appended claims and their equivalents.

What is claimed:

1. A structure included in a semiconductor device comprising:
    a fuse box guard ring defining an interior region of the fuse box inside the fuse box guard ring and defining an exterior region of the fuse box outside the fuse box guard ring, the fuse box guard ring including at least one straight linear member and protruding support members protruding into the exterior region from the straight linear member.

2. A structure according to claim 1 wherein the fuse box guard ring is included in a peripheral region of the semiconductor device, wherein a step height difference between a layer in the peripheral region and the layer in a memory cell array region comprises at least about 1.5 microns.

3. A structure according to claim 1 wherein the protruding support members are spaced apart from fuse contacts located adjacent the fuse box guard ring.

4. A structure according to claim 1 wherein the protruding support members comprise artifacts resulting from a photolithographic process used to form the fuse box guard ring.

5. A structure according to claim 1 wherein the protruding support members decrease an aspect ratio of at least one sidewall of the fuse box guard ring where the protrusions are located compared to portions of the sidewall without the protrusions.

6. A structure according to claim 1 wherein the protruding support members protrude only from a lower portion of the fuse box guard ring formed beneath a metal contact.

7. A structure according to claim 1 wherein the protruding support members comprise first protruding support members and wherein the structure further comprises second protruding support members that protrude into the interior region from the the straight linear member.

8. A structure according to claim 7, wherein the first and second protruding support members protrude at locations directly opposite one another on respective first and second sides of the straight wall member.

9. A structure according to claim 7 wherein the first and second protruding support members protrude at locations offset from one another on respective first and second sides of the straight wall member.

10. A structure included in a semiconductor device comprising:
    a fuse box guard ring defining an interior region of the fuse box inside the fuse box guard ring and defining an exterior region of the fuse box outside the fuse box guard ring, the fuse box guard ring including protruding support members protruding from an interior sidewall of the fuse box guard ring, wherein the protruding support members protrude from opposing portions of the interior sidewall and completely traverse the interior region toward one another to form respective interior fuse box guard ring cross-members.

11. A structure according to claim 10 wherein the interior fuse box guard ring cross-members further comprise respective extension portions that extend orthogonal to the cross-members to contact the interior sidewall of the fuse box guard ring.

12. A structure according to claim 11 wherein the interior fuse box guard ring cross-members and the respective extension portions occupy the interior region so that voids are formed co-located at the contacts for the fuses.

13. A structure according to claim 12 wherein the protruding support members are formed in a plate poly layer of the semiconductor device.

14. A semiconductor device comprising:
    a first region of the device; and
    a fuse box guard ring, included in a second region of the device that is spaced apart from the first region, wherein the fuse box guard ring defines an interior region of the fuse box inside the fuse box guard ring and an exterior region of the fuse box outside the fuse box guard ring, the fuse box guard ring including at least one straight wall member and protruding support members protruding into the exterior region from the straight wall member.

15. A semiconductor device according to claim 14 wherein the protruding support members protrude only from a side wall of a plate poly layer included in the fuse box guard ring.

16. A semiconductor device according to claim 14 wherein the first region comprises a memory cell array region and the second region comprises a peripheral region.

17. A semiconductor device according to claim 16 where a step height difference between a plate poly layer in the memory cell array region and the plate poly layer in the peripheral region comprises at least about 1.5 microns.

18. A semiconductor device comprising:
    a first pattern at a first height above a substrate included in a first region of the device; and
    a second pattern at a second height above the substrate defining a step height difference relative to the first pattern, included in a second region of the device that is spaced apart from the first region, wherein the second pattern includes at least one straight wall member having first and second opposing side walls, the second pattern including respective first and second protruding support members protruding from the first and second side walls.

19. A semiconductor device according to claim 18 wherein the first region comprises a memory cell array region and the second region comprises a peripheral region.

20. A semiconductor device according to claim 19 where a step height difference between a plate poly layer in the memory cell array region and the plate poly layer in the peripheral region comprises at least about 1.5 microns.

21. A method of forming a structure in a semiconductor device comprising:
    forming a photoresist layer on a conductive layer in first and second spaced apart regions of the semiconductor device;
    patterning the photoresist layer to form a first photoresist pattern in the first region that has a first thickness and a second pattern in the second region that has a second thickness greater than the first thickness and that comprises a straight wall portion and protruding portions that extend from sidewalls of the straight wall portion to provide support thereof; and
    etching the conductive layer using the second photoresist pattern to form a fuse box guard ring including protruding support members protruding from side walls of the guard ring.

22. The method of claim 21, wherein the first region comprises a memory cell array region and wherein the second region comprises a peripheral region.

* * * * *